US 6,671,109 B2

(12) United States Patent
Kunii

(10) Patent No.: US 6,671,109 B2
(45) Date of Patent: Dec. 30, 2003

(54) ND FILTER HAVING COMPOSITE PVD FILM OF METAL AND ITS OXIDE

(75) Inventor: Koki Kunii, Koriyama (JP)

(73) Assignee: Nidec Copal Corporation, Tokyo (JP)

( * ) Notice: Subject to any disclaimer, the term of this patent is extended or adjusted under 35 U.S.C. 154(b) by 0 days.

(21) Appl. No.: 10/202,635

(22) Filed: Jul. 25, 2002

(65) Prior Publication Data

US 2003/0026014 A1 Feb. 6, 2003

(30) Foreign Application Priority Data

Jul. 27, 2001 (JP) ........................................ 2001-226999

(51) Int. Cl.⁷ ................................................. G02B 5/22
(52) U.S. Cl. ........................ 359/888; 359/885; 359/588
(58) Field of Search ................................. 359/888, 885, 359/588; 427/255.31, 255.32; 428/689; 396/108

(56) References Cited

U.S. PATENT DOCUMENTS

| | | | | |
|---|---|---|---|---|
| 3,679,291 A | * | 7/1972 | Apfel | 359/587 |
| 4,488,775 A | | 12/1984 | Yamamoto | |
| 4,960,310 A | * | 10/1990 | Cushing | 359/888 |
| 5,715,103 A | * | 2/1998 | Amano | 359/888 |

FOREIGN PATENT DOCUMENTS

| | | | |
|---|---|---|---|
| JP | 55-025044 | * | 2/1980 |
| JP | 57-195207 | | 11/1982 |
| JP | 59-38701 | | 3/1984 |
| JP | 61-183604 | | 8/1986 |
| JP | 64-51347 | | 2/1989 |
| JP | 2-109334 | | 8/1990 |
| JP | 5-93811 | | 4/1993 |
| JP | 7-63915 | | 3/1995 |
| JP | 10-133253 | | 5/1998 |
| JP | 10-133254 | | 5/1998 |

* cited by examiner

Primary Examiner—Drew A. Dunn
Assistant Examiner—Leo Boutsikaris
(74) Attorney, Agent, or Firm—Nixon Peabody, LLP

(57) ABSTRACT

A neutral density filter has a multi-layer structure of thin films laminated on a substrate made of a transparent material. The multi-layer structure contains a transparent thin film composed of a dielectric material effective to transmit the incident light and a non-transparent thin film effective to absorb a part of the incident light. The non-transparent thin film is composed of a metal material which is deposited by vacuum evaporation. The non-transparent thin film contains an oxide of the metal material, which is generated during the vacuum evaporation by introducing a gas containing an oxygen while maintaining a vacuum degree in a range of $1 \times 10^{-3}$Pa to $1 \times 10^{-2}$Pa, and which is deposited concurrently with the metal material.

8 Claims, 9 Drawing Sheets

FIG. 3

| FILM FORMATION CONDITIONS | | SUBSTRATE TEMPERATURE | 100°C |
|---|---|---|---|
| | | REACHED VACUUM DEGREE | $1 \times 10^{-3}$ Pa |
| Ti | | VAPOR DEPOSITION SPEED | 1 nm/sec |
| | | VAPOR DEPOSITION VACUUM DEGREE | $4 \times 10^{-3}$ Pa |
| | | INTRODUCED GAS | Air(N2:O2=4:1) |
| SiO2 | | VAPOR DEPOSITION SPEED | 1 nm/sec |
| | | INTRODUCED GAS | — |
| Al2O3 | | VAPOR DEPOSITION SPEED | 1 nm/sec |
| | | INTRODUCED GAS | — |

FIG. 8

|  | DESIGNED VALUE | | SAMPLE (INITIAL) | | SAMPLE (AFTER HEAT TREATMENT) | |
|---|---|---|---|---|---|---|
|  | AVERAGE VALUE | VARIATION | AVERAGE VALUE | VARIATION | AVERAGE VALUE | VARIATION |
| TRANSMITTANCE | 27.60% | ±0.75% | 27.50% | ±1.01% | 31.20% | ±0.15% |
| TRANSMISSION DENSITY | 0.559 | ±0.012 | 0.56 | ±0.016 | 0.505 | ±0.002 |

ND FILTER HAVING COMPOSITE PVD FILM OF METAL AND ITS OXIDE

BACKGROUND OF THE INVENTION

1. Field of the Invention

The present invention relates to a thin-film ND filter and a manufacturing method of the ND filter. The neutral density (ND) filter is used as a light amount restrictor for a purpose of evenly attenuating a transmitted light amount over a whole visible range.

2. Description of the Related Art

In a photographing system, under an excessively high luminance of an object, there may be a case of over exposure where an excessive amount of light is incident upon a photosensitive surface even with a minimum aperture diameter obtained by a diaphragm. In cope with such a case, an ND filter is often attached to a part of the photographing system so as to regulate an incident light amount upon the photosensitive surface. In this case, for a spectral property of the ND filter, the incident light amount must be reduced evenly throughout the visible wavelength range, hence it is necessary to secure a uniform transmittance over the whole visible range. In the photographing system such as a camera and video, a plastic film base ND filter is in heavy use for a purpose of evenly attenuating the light amount over the whole visible range. The ND filter is roughly divided into two types: a first type obtained by applying or incorporating carbon particles, dye, and the like into a plastic film; and a second type obtained by forming a thin film of ND filter on the plastic film.

For the first type in which the carbon particles, dye, and the like are applied or incorporated into the plastic film, the filter surface has an insufficient film hardness and is easily damaged. Moreover, when the carbon particles, dye, and like are incorporated, films having a high water absorbing property are used such as triacetate cellulose or triacetyl cellulose (TAC). Therefore, warp or strain is generated because of a change of environment. Such an ND filter is assembled into a shutter unit of a camera which has been more and more downsized. In this case, there is possibility that the filter contacts other constituting components during the driving of the shutter unit, and may break. Moreover, as a problem common to the first type, a uniform light amount attenuation, which has been required for an advanced photographing system in recent years, cannot be achieved in a wavelength range of about 400 to 650 nm for use in the photographing system, and an additional step of adjusting a color balance may be performed for compensating the deficiency of the ND filter. This causes a problem of manufacturing cost increase.

For the second type in which the ND filter is formed by depositing a thin film on the plastic film, a metal material is used as a light absorbing thin film as disclosed in Japanese Patent Application Laid-Open Nos. 1982-195207 and 1986-183604. Otherwise, a metal oxide film is used as disclosed in Japanese Patent Application Laid-Open Nos. 1989-51347 and 1995-63915. When the metal material is used as the absorbing film, the metal film has a thickness of 10 nm or less and is very thin, and it is difficult to control the film thickness for obtaining target optical properties. Furthermore, when the ND filter is placed under an ordinary environment for a long time after the film formation, oxidation of the metal film causes phenomena of transmittance increase or transmittance flatness deterioration in the ND filter with respect to the wavelength of the incident light. A countermeasure to such a deficiency may include sealing the metal film with an adhesive in order to suppress the deterioration of the film with an elapse of time, and using cryolite to laminate the film. This countermeasure increases the number of fabrication steps and disadvantageously thickens the film. On the other hand, when metal oxide is used in the light absorbing film, in general the metal oxide material is used as an evaporation source and deposited into the absorption film on the plastic film by vacuum evaporation. In this case, there is an advantage that film hardness increases. However, since it is difficult to adjust a whole film stress, a crack is generated in the film surface or the thin film peels. Moreover, the film is hard, and therefore a problem occurs that the film surface breaks or cracks during the process of shaping the film into a ND filter product.

SUMMARY OF THE INVENTION

The present invention has been developed in consideration of the above-described prior-art problems, and an object thereof is to provide a thin-film ND filter in which a light amount can uniformly be attenuated throughout the visible range and which is superior in durability. To achieve the object, according to the present invention, there is provided a neutral density filter for absorbing an incident light. The ND filter comprises a substrate made of a transparent material, and a multi-layer structure of thin films laminated on the substrate, the multi-layer structure containing a transparent thin film composed of a dielectric material effective to transmit the incident light and a non-transparent thin film effective to absorb a part of the incident light, wherein the non-transparent thin film is composed of a metal material which is deposited by vacuum evaporation, the non-transparent thin film containing an oxide of the metal material, which is generated during the vacuum evaporation by introducing a gas containing an oxygen while maintaining a vacuum degree in a range of $1 \times 10^{-3}$ Pa to $1 \times 10^{-2}$ Pa, and which is deposited concurrently with the metal material.

Preferably, the transparent thin film and the non-transparent thin film are successively laminated on the substrate to form the multi-layer structure, and then the multi-layer structure is annealed under an oxidizing atmosphere containing 10% or more of oxygen so as to saturate optical properties of the multi-layer structure. The metal material of the non-transparent thin film is selected from a group consisting of Ti, Cr and Ni, and the dielectric material of the transparent thin film is selected from a group consisting of $SiO_2$ and $Al_2O_3$. Expediently, the transparent thin film and the non-transparent thin film are successively laminated in a predetermined order at a predetermined thickness to form the multi-layer structure effective to prevent reflection of the incident light.

In the present invention, the ND filter is formed by the thin film technology. This can inhibit the generation of damage because of insufficient surface hardness, which has been a defect of the conventional type. Moreover, when a plastic film substrate having a high durability is used as the transparent substrate, shape changes such as warp and strain can be suppressed. Furthermore, in the present invention, the metal is used as the raw material for forming the light absorbing film, and the mix gas containing oxygen is introduced during the film formation. When the partial pressure of oxygen and the total pressure of the mix gas are optimized, the metal oxide can be added into the metal film with a good reproducibility. As compared with the absorbing film formed only of the metal material, an absorption coefficient can be reduced by the introduction of the metal oxide. The film thickness is increased, and it is therefore easy to control the film thickness in order to obtain the target optical properties. To suppress the change of the optical properties with an elapse of time which is one of problems in using the metal material for the light absorbing film, the metal material is subjected to a heat treatment or annealing in an oxidization atmosphere containing oxygen beforehand. The changes of the optical properties by the oxidation of the metal material are thus forcibly saturated, and an ND filter stable for a long time can be obtained. Additionally, when the heat treatment is performed, the optical properties certainly change. Unless some measure is taken, flatness of the absorption with respect to wavelength is possibly lost by the heat treatment. Then, the film is designed by counting a change amount by the heat treatment in a film formation stage beforehand, and thereby the satisfactory flatness of the transmission property after the heat treatment is realized. Concretely, a variation of transmission density can be controlled to ±0.01 or less in a wavelength range of 400 to 650 nm. Moreover, to prevent the crack or peel after the film formation which is one of problems in using the metal oxide for the light absorbing film, the dielectric film having a high adhesion such as $SiO_2$ is used in a first layer on a substrate side. Additionally, the stress of the whole laminated films is adjusted, so that the ND filter indicating a satisfactory surface state can be obtained.

BRIEF DESCRIPTION OF THE DRAWINGS

FIG. 3 is a table showing film formation conditions of the ND filter according to the present invention.

FIG. 8 is a table showing the optical properties of the ND filter according to the present invention.

DESCRIPTION OF THE PREFERRED EMBODIMENT

Figure 1:
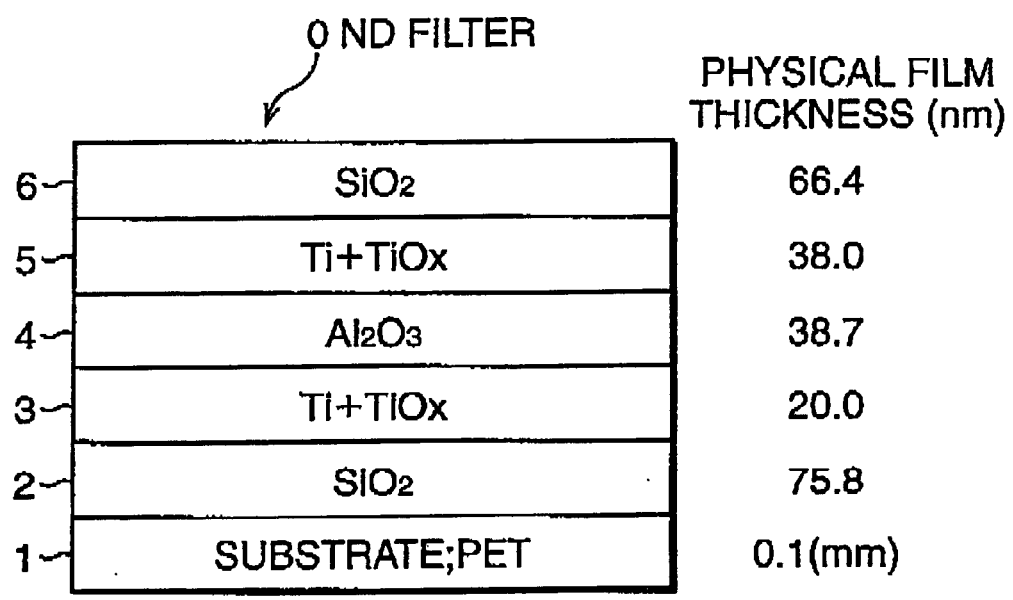
FIG. 1 is a schematic sectional view showing a layer structure of an ND filter according to the present invention.

An embodiment of the present invention will be described hereinafter with reference to the accompanying drawings. FIG. 1 is a schematic sectional view showing a constitution of a thin-film ND filter according to the present invention. As shown in FIG. 1, according to the present invention, an ND filter 0 is a thin film type of a multi-layer structure in which light absorbing films 3, 5 and dielectric films 2, 4, 6 are laminated on a transparent substrate 1. The light absorbing films 3, 5 are non-transparent films formed using metal materials as raw materials by physical vapor deposition (PVD) such as vacuum evaporation. As a characteristic matter, an oxide of the metal material is generated by introducing a mix gas containing oxygen during the film formation while maintaining a vacuum degree in a range of $1\times10^{-3}$ Pa to $1\times10^{-2}$ Pa. In other words, the light absorbing films 3, 5 have a composite material constitution of the metal and metal oxide. Preferably, after laminating the light absorbing films 3, 5 and dielectric films 2, 4, 6 on the transparent substrate 1, the laminate structure is heated or annealed in an oxydizing atmosphere containing 10% or more of oxygen, so that a change of optical properties may be saturated. The metal materials of the light absorbing films 3, 5 are selected from Ti, Cr, and Ni. On the other hand, the dielectric films 2, 4, 6 are formed of $SiO_2$ and $Al_2O_3$. In this case, the dielectric films 2, 4, 6 and light absorbing films 3, 5 are laminated in a predetermined film thickness and predetermined order so that a reflection preventive property can be imparted to the ND filter.

A concrete film constitution of the ND filter 0 will next be described with reference to FIG. 1. First, the transparent substrate 1 is formed of polyethylene terephthalate (PET) having a thickness of 0.1 mm. Additionally, the present invention is not limited to this material, and a polyester film and polycarbonate (PC) film other than PET can be used. In order to reduce a light amount in an aperture diaphragm of camera, the polyester film and polycarbonate film such as PET are preferable. However, unless the application field is limited, glass or plastic transparent in an applicable use wavelength range can appropriately be used as the transparent substrate 1. The first dielectric film 2 is formed of $SiO_2$ on the transparent substrate 1, and has a physical film thickness of 75.8 nm. The first light absorbing film 3 formed on the first dielectric film 2 is formed of metal Ti and oxide TiOx, and has a physical film thickness of 20.0 nm. The second dielectric film 4 formed on the first light absorbing film 3 is formed of $Al_2O_3$, and has a physical film thickness of 38.7 nm. The second light absorbing film 5 formed on the second dielectric film 4 is formed of a mixture of metal Ti and oxide TiOx, and has a physical film thickness of 38.0 nm. The third dielectric film 6 formed on the second light absorbing film 5 is formed of $SiO_2$, and has a physical film thickness of 66.4 nm. Additionally, this laminate constitution is only an illustration, and does not limit the scope of the present invention. With an optical thin film, a transparent ceramic material is referred to as the dielectric film in a usual use wavelength. When the dielectric film with a thickness (about several times a wavelength) exhibiting a light interference effect is laminated, the optical properties of an incident light, such as a reflection amount, transmission amount, polarization, and phase can freely be adjusted. In the present embodiment, with the multi-layer constitution shown in FIG. 1, the reflection preventive property is imparted to the ND filter. On the other hand, the light absorbing film has a function of literally absorbing the light in the desired application wavelength range, and the metal is usually used in the visible range. In the present invention, the oxides are introduced particularly into the metal material, so that the optical and physical properties are improved.

Figure 2:
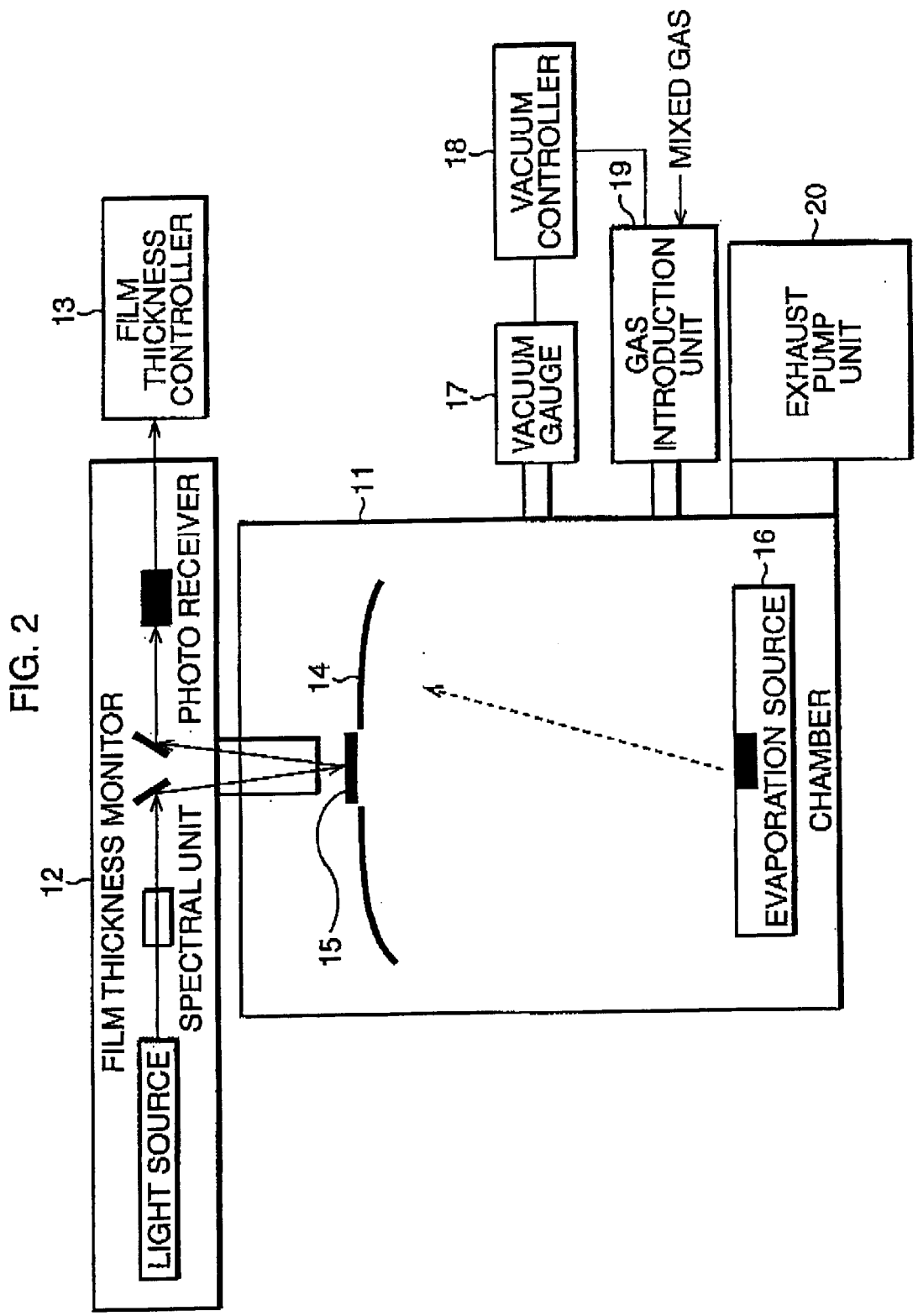
FIG. 2 is a schematic block diagram showing a vacuum evaporation apparatus for use in producing the ND filter according to the present invention.

FIG. 2 is a schematic block diagram showing one example of a vacuum evaporation apparatus for use in preparing the ND filter shown in FIG. 1. As shown in FIG. 2, the present apparatus is constituted mainly of a vacuum chamber 11. A film thickness monitor 12 and film thickness controller 13 are attached onto the vacuum chamber. The vacuum chamber 11 contains a substrate holder 14 for supporting/fixing a substrate as a treatment object, a film thickness monitoring substrate 15, and an evaporation source 16. The film thickness monitor 12 includes a light source, spectral unit, and photo receiver. A light emitted from the spectral unit is incident upon the film thickness monitoring substrate 15, the light reflected from the substrate 15 is incident upon the photo receiver, and an output is sent to the film thickness controller 13. When the film thickness is monitored in real time in this manner, the light absorbing films and dielectric films are formed at desired thickness on the substrate.

The vacuum chamber 11 is connected to a vacuum gauge section 17, vacuum controller 18, gas introduction unit 19, and exhaust pump unit 20. In the present embodiment, an APC method is used in order to keep a vacuum degree to be constant in the chamber 11. Concretely, a feedback control is executed via the vacuum gauge section 17 and vacuum controller 18, so that the gas introduction unit 19 is controlled and the amount of the mix gas introduced into the chamber 11 is adjusted. Additionally, the present invention is not limited to this, and a method of adjusting an introduction amount to be constant in a needle valve may also be adaptable.

FIG. 3 is a table showing film formation conditions used in the vacuum vapor deposition apparatus shown in FIG. 2 to prepare the ND filter shown in FIG. 1. As shown in FIG. 3, a substrate temperature is set to 100° C. Moreover, a reached vacuum degree of the chamber is set to $1 \times 10^{-3}$ Pa. Here, to form the light absorbing films 3, 5, Ti is used as the raw material, and a vapor deposition speed is set to 1 nm/sec. In the present embodiment, air containing nitrogen and oxygen mixed at a ratio of 4:1 is used as an oxidization gas which is introduced during the vacuum evaporating of Ti. Additionally, the present invention is not limited to this, and a mix gas containing oxygen at a ratio of 50% or less is generally used. Moreover, a vapor deposition vacuum degree in introducing the mix gas containing oxygen is set to $4 \times 10^{-3}$ Pa. Additionally, the present invention is not limited to this. In general, when the vacuum degree is maintained to be constant in a range of $1 \times 10^{-3}$ Pa to $1 \times 10^{-2}$ Pa, it is possible to form the light absorbing film having satisfactory optical and physical properties and a composite structure of the metal and oxide thereof. Subsequently, to form the dielectric films 2, 6, $SiO_2$ is used as the evaporation source, and the vapor deposition speed is set to 1 nm/sec. When the film of $SiO_2$ is formed, a particularly reactive gas is not introduced. Moreover, to form the dielectric film 4, $Al_2O_3$ is used as the evaporation source, and the vapor deposition speed is set to 1 nm/sec. Also in this case, the reactive gas is not especially introduced.

Figure 4:
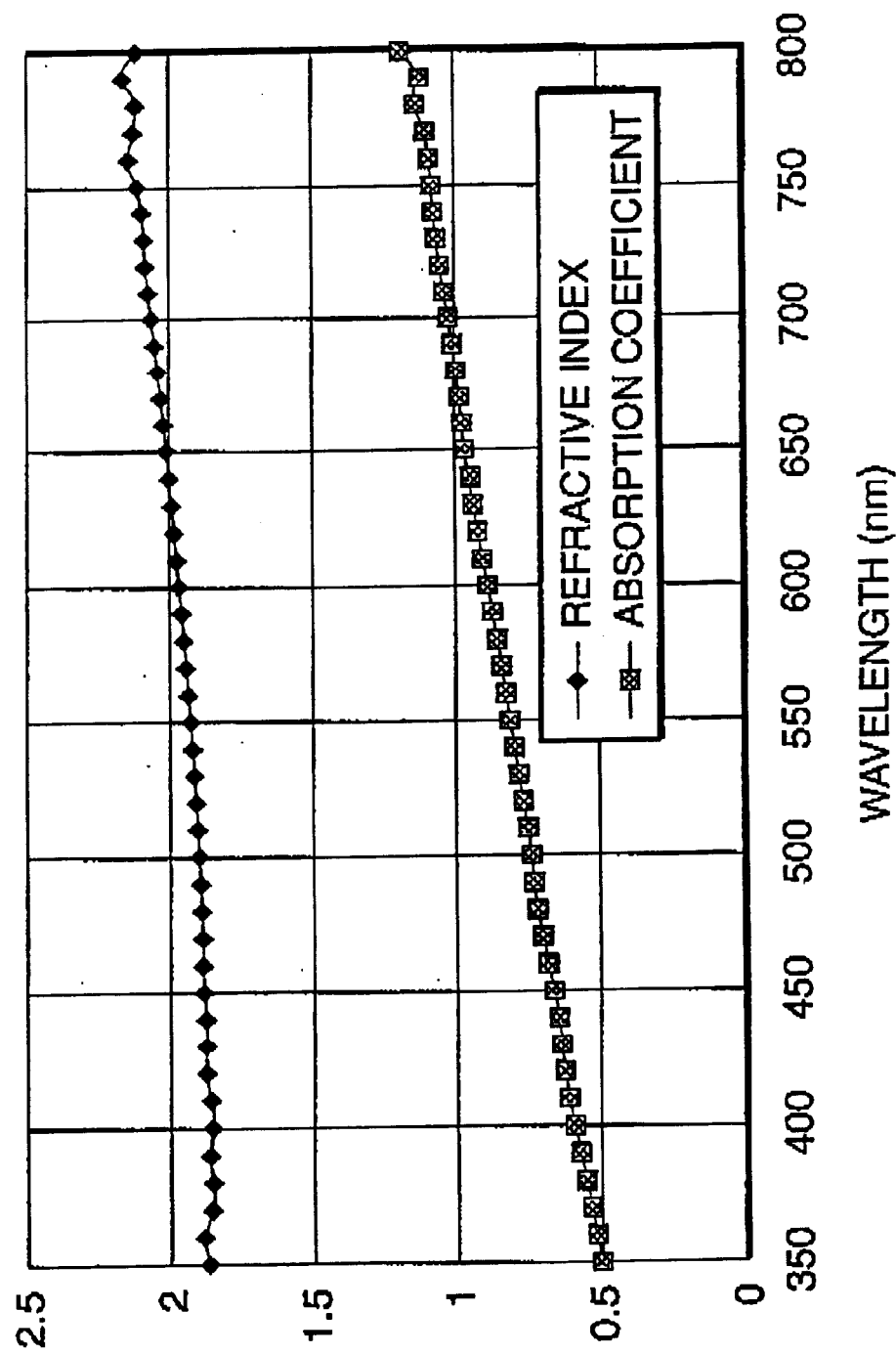
FIG. 4 is a graph showing optical properties of an light absorbing film included in the ND filter according to the present invention.

FIG. 4 is a graph showing the optical properties of the light absorbing film formed under the conditions shown in FIG. 3. The abscissa indicates the wavelength, and the ordinate indicates a refractive index and absorption coefficient. As apparent from this graph, with an increase of the wavelength, the light absorbing film formed of the mixture of T and TiOx tends to exhibit a higher absorption coefficient.

Figure 5:
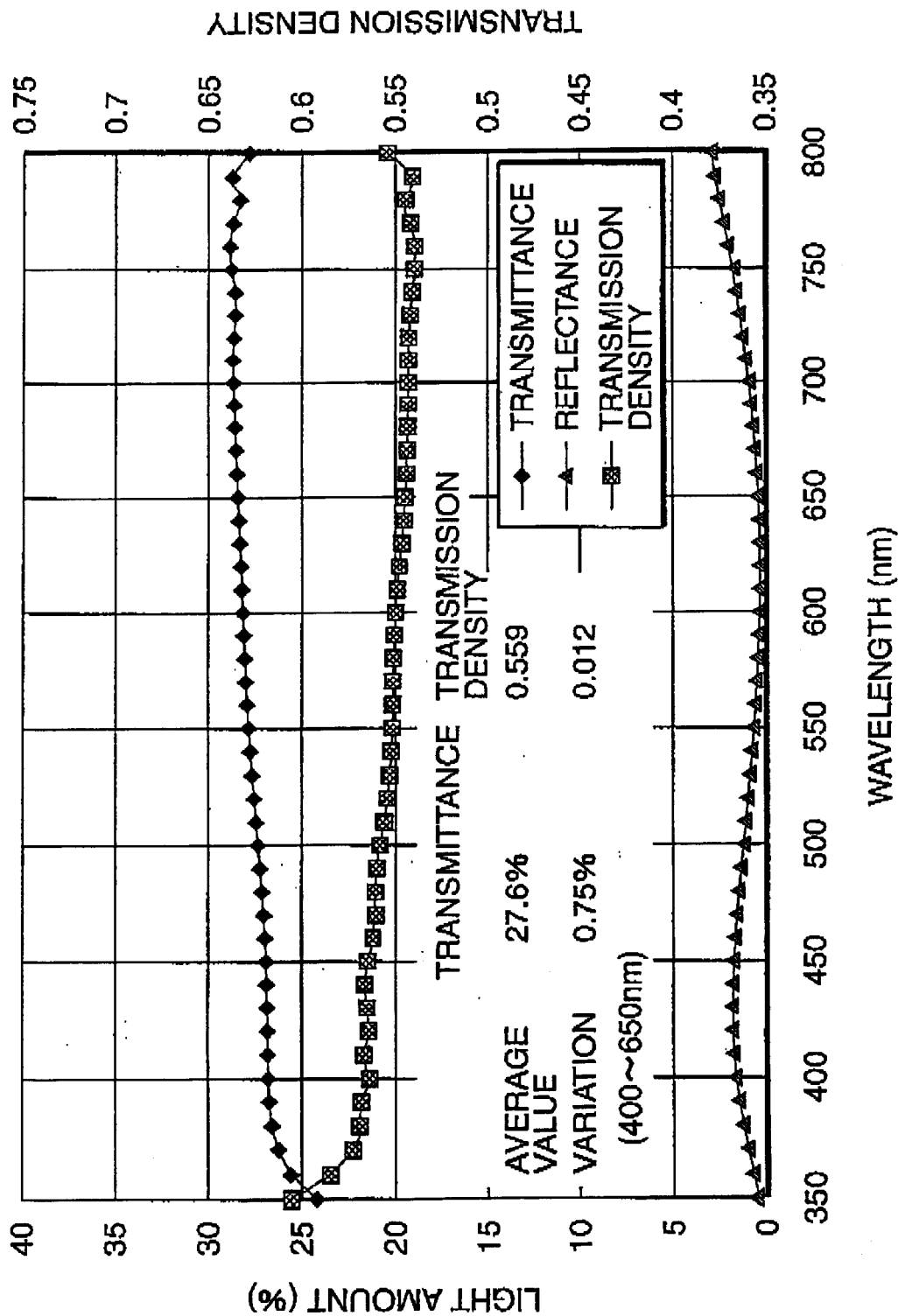
FIG. 5 is a graph showing the optical properties of the ND filter according to the present invention.

FIG. 5 is a graph showing the optical properties of the ND filter having the laminate structure shown in FIG. 1 under the film formation conditions shown in FIG. 3. The abscissa indicates the wavelength of the visible range, the left ordinate indicates a light amount (%) representing a measure of reflectance and transmittance, and the right ordinate indicates a transmission density. Additionally, a transmittance T and transmission density D has a relation of D=log(1/T). FIG. 5 shows simulation results in a design stage, not the optical properties of the actually prepared ND filter. Finally, it is ideal that the transmittance in the visible wavelength range is flat. In the design stage, in consideration of an influence of a heat treatment performed in a post process, the transmittance is designed to gradually increase to a long wavelength side from a short wavelength side. Because it is predicted that for the optical properties of the ND filter having a five-layers constitution after the heat treatment, the transmittance tends to increase toward the short wavelength side in the visible range.

Figure 6:
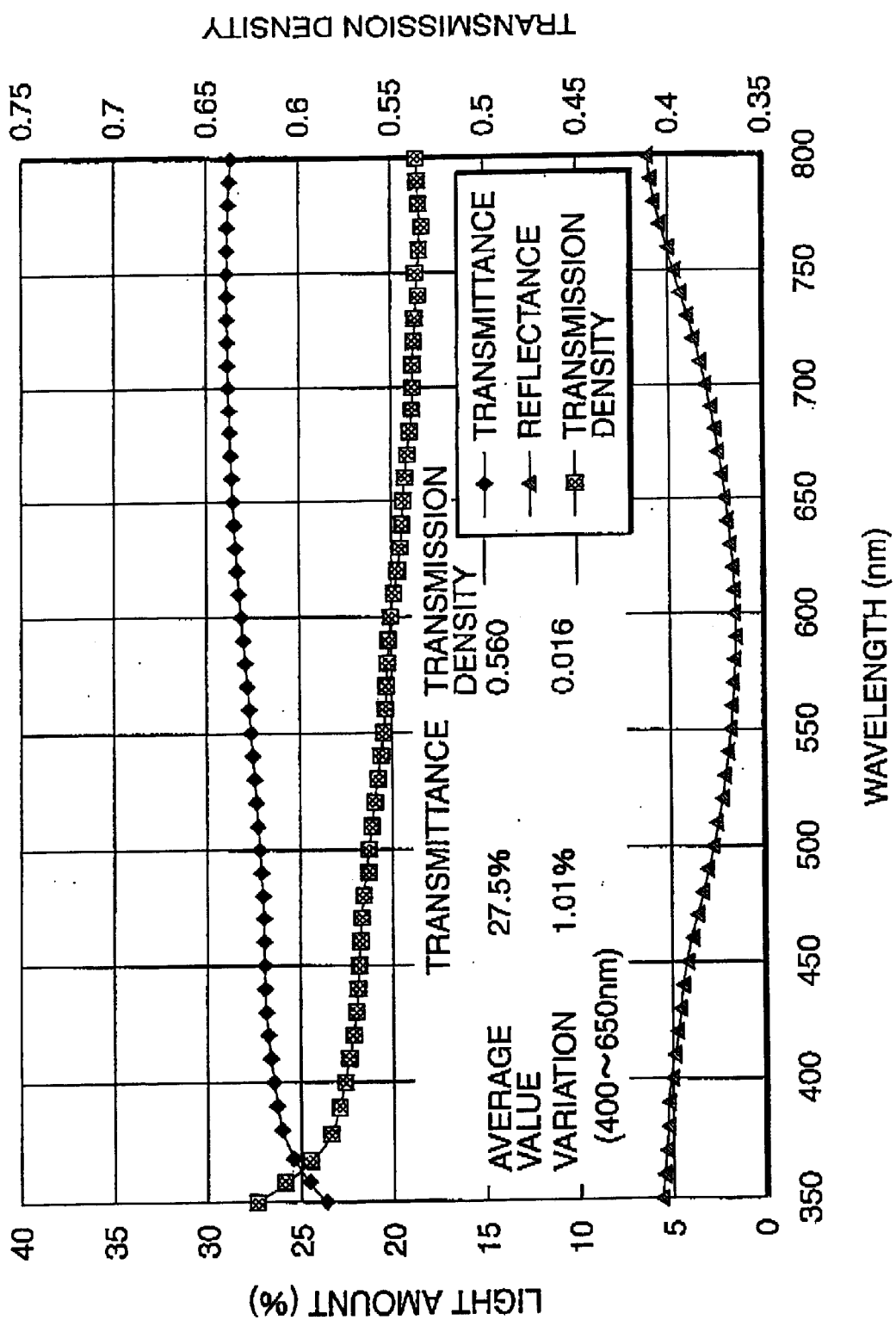
FIG. 6 is a graph showing the optical properties of the ND filter according to the present invention.

FIG. 6 shows initial properties of the actually ND filter having the laminate structure shown in FIG. 1 under the film formation conditions shown in FIG. 3. Additionally, to facilitate the understanding, the reflectance, transmittance, and transmission density are measured similarly as FIG. 4. As apparent from the graph, the optical properties are obtained substantially as designed, and the transmittance gradually increases toward the long wavelength side from the short wavelength side.

Figure 7:
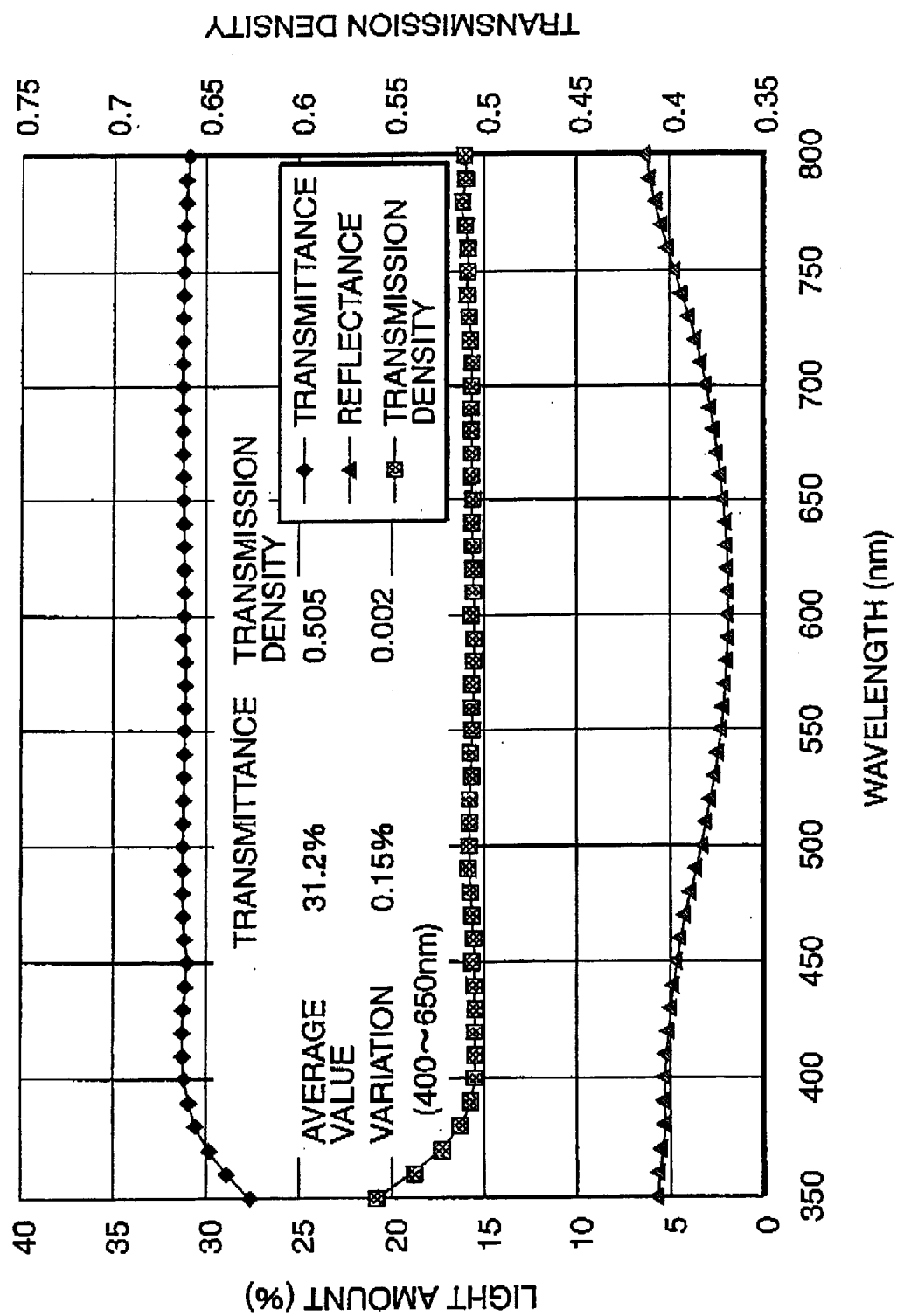
FIG. 7 is a graph showing the optical properties of the ND filter according to the present invention.

FIG. 7 showing the optical properties of the ND filter after the heat treatment. To facilitate the understanding, the transmittance, reflectance, and transmission density are measured similarly as FIGS. 5 and 6. In this heat treatment, the filter was kept at 80° C. for 50 hours in an oxidation atmosphere (atmospheric air) containing nitrogen and oxygen at a mixture ratio of 4:1. Additionally, the present invention is not limited to this. For general heat treatment conditions, a heat treatment temperature is set to such an extent that the substrate is not damaged with the gas having an oxygen density of 10% or more. In general, when the oxygen density is increased and high-temperature heating is performed, the change of the optical properties with the elapse of time is effectively saturated. As shown in the graph, after the heat treatment, a transmitted light is uniformly attenuated without any dependence on the wavelength in the visible range, and the ND filter can be obtained in which the reflection is suppressed in the filter surface. As described above, in the design stage, the transmittance is designed beforehand to gradually increase toward the long wavelength side from the short wavelength side so that the changes of the optical properties after the heat treatment are compensated. This design can be freely modified, so that the film formation order and thickness of the respective dielectric films and light absorbing films constituting the laminate structure shown in FIG. 1 are optimized. When the heat treatment is performed, the transmittance has a tendency to increase to the short wavelength side from the long wavelength side. Thereby, an initial deviation is canceled and removed, and as a result the transmission property remarkably superior in flatness throughout the visible range can be obtained.

FIG. 8 shows a table in which a designed value, initial value and final value after the heat treatment are listed concerning the transmittance and transmission density. The designed value of flatness is ±0.75%, the initial value of the actual product is ±1.01%, and the flatness is improved to ±0.15% after the heat treatment. Moreover, in the actual product, the surface property of the formed film is satisfactory just after the film formation and even after the heat treatment. Even when an adhesive tape was attached to the film surface and quickly stripped off, the film did not peel. Moreover, for a purpose of checking the durability of the prepared ND filter, the filter was left to stand under high temperature/humidity conditions (60° C., 90% RH) for 240 hours, but the variation amount of the optical property was about 0.5% and small, and any change did not appear on the film surface. Additionally, even when the prepared ND filter was processed to cut into a product shape, defects such as film crack and peel were not generated. As described above, it has been confirmed that it is possible to prepare the ND filter flat in the transmission property in the visible range and superior in durability.

Figure 9:
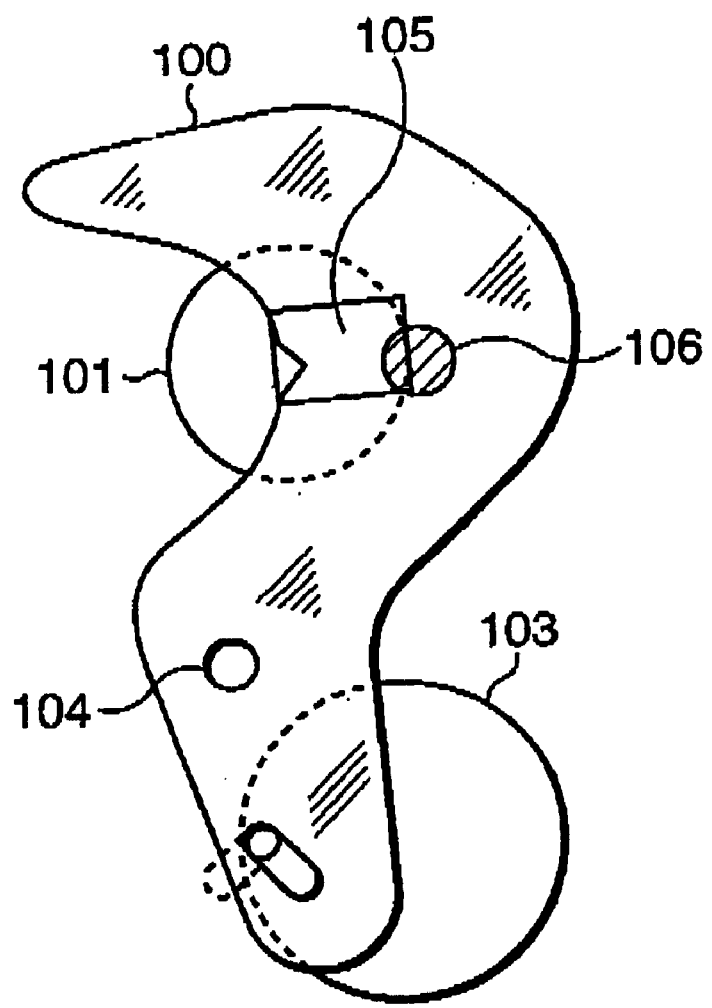
FIG. 9 is a schematic diagram showing a diaphragm apparatus of a camera using the ND filter of the present invention.

FIG. 9 is a schematic diagram showing an aperture diaphragm of camera in which the present ND filter is applied to a diaphragm blade. An ND filter 105 is fixed to a concave portion of a diaphragm blade 100, which is one of a prepared pair of blades, by an adhesive 106 or heat welding. The diaphragm blade 100 is constituted to rotate around a support pin 104 by a driving portion 103 and open/close an aperture 101.

As described above, according to the present invention, when the metal material is used as the raw material to form the light absorbing film by the vapor deposition, the reactive gas containing oxygen is introduced during the film formation, and the vacuum degree is maintained to be constant in a range of $1 \times 10^{-3}$Pa to $1 \times 10^{-2}$Pa. In this state, the oxide of the metal material is generated. That is, the thin-film ND filter according to the present invention includes the light absorbing film formed of the metal and oxide thereof. The shape changes such as warp and strain, which have been the defects of the conventional ND filter of the applied or incorporated type, can be suppressed. Moreover, the film formation conditions in depositing the thin-film ND filter are optimized. Thereby, difficulty in obtaining reproducibility of the metal material for the absorbing film can be solved. Furthermore, the heat treatment is performed in the oxygen atmosphere, so that the changes of the optical properties with the elapse of time are suppressed. The film is designed counting the optical changes during the heat treatment, so that the ND filter superior in the flatness of the transmission property throughout the visible range can be obtained. Additionally, there can be obtained the ND filter which has a satisfactory surface property without any film crack or peel, which might be the problem in using the metal oxide in the light absorbing film.

What is claimed is:

1. A neutral density filter for absorbing an incident light, comprising:

a substrate made of a transparent material; and a multi-layer structure of thin films laminated on the substrate, the multi-layer structure containing a transparent thin film composed of a dielectric material effective to transmit the incident light and a non-transparent thin film effective to absorb a part of the incident light, wherein the non-transparent thin film is composed of a metal material which is deposited by vacuum evaporation, the non-transparent thin film containing an oxide of the metal material, which is generated during the vacuum evaporation by introducing a gas containing an oxygen while maintaining a vacuum degree in a range of $1 \times 10^{-3}$Pa to $1 \times 10^{-2}$Pa, and which is deposited concurrently with the metal materials.

2. The neutral density filter according to claim 1, wherein the transparent thin film and the non-transparent thin film are successively laminated on the substrate to form the multi-layer structure, and then the multi-layer structure is annealed under an oxidizing atmosphere containing 10% or more of oxygen so as to saturate optical properties of the multi-layer structure.

3. The neutral density filter according to claim 1, wherein the metal material of the non-transparent thin film is selected from a group consisting of Ti, Cr and Ni, and the dielectric material of the transparent thin film is selected from a group consisting of $SiO_2$ and $Al_2O_3$.

4. The neutral density filter according to claim 1, wherein the transparent thin film and the non-transparent thin film are successively laminated in a predetermined order at a predetermined thickness to form the multi-layer structure effective to prevent reflection of the incident light.

5. A method of producing a neutral density filter absorbing an incident light, the method comprising the steps of:

preparing a substrate made of a transparent material; and forming on the substrate a multi-layer structure of thin films including a transparent thin film formed of a dielectric material effective to transmit the incident light and a non-transparent thin film effective to absorb a part of the incident light, wherein the step of forming the multi-layer structure includes forming the non-transparent thin film by depositing a metal material by vacuum evaporation, generating an oxide of the metal material during the vacuum evaporation by introducing a gas containing an oxygen while maintaining a vacuum degree in a range of $1 \times 10^{-3}$Pa to $1 \times 10^{-2}$Pa, and depositing the oxide of the metal material concurrently with the metal material so that the non-transparent thin film is made of a composite of the metal material and the oxide thereof.

6. The method according to claim 5, wherein the step of forming comprises successively laminating the transparent thin film and the non-transparent thin film on the substrate to form the multi-layer structure, and then annealing the multi-layer structure under an oxidizing atmosphere containing 10% or more of oxygen so as to saturate optical properties of the multi-layer structure.

7. The method according to claim 5, wherein the metal material of the non-transparent thin film is selected from a group consisting of Ti, Cr and Ni, and the dielectric material of the transparent thin film is selected from a group consisting of $SiO_2$ and $Al_2O_3$.

8. The method according to claim 5, wherein the step of forming comprises successively laminating the transparent thin film and the non-transparent thin film in a predetermined order at a predetermined thickness to form the multi-layer structure effective to prevent reflection of the incident light.

* * * * *